(12) United States Patent
Heuser

(10) Patent No.: US 9,233,802 B2
(45) Date of Patent: Jan. 12, 2016

(54) CONVEYOR DEVICE FOR THE CONVEYANCE OF WORKPIECES, SPECIFICALLY OF CIRCUIT BOARDS, IN THE CONVEYANCE DIRECTION ALONG A CONVEYANCE PATH

(71) Applicant: Viscom AG, Hannover (DE)

(72) Inventor: Martin Heuser, Hannover (DE)

(73) Assignee: Viscom AG, Hannover (DE)

( * ) Notice: Subject to any disclaimer, the term of this patent is extended or adjusted under 35 U.S.C. 154(b) by 0 days.

(21) Appl. No.: 14/163,211

(22) Filed: Jan. 24, 2014

(65) Prior Publication Data
US 2015/0114796 A1    Apr. 30, 2015

(30) Foreign Application Priority Data

Oct. 31, 2013 (DE) .......................... 10 2013 112 056
Nov. 20, 2013 (EP) ..................................... 13005442

(51) Int. Cl.
| | |
|---|---|
| *B65G 47/26* | (2006.01) |
| *B65G 47/30* | (2006.01) |
| *B65G 15/22* | (2006.01) |
| *B65G 47/29* | (2006.01) |
| *H01L 21/677* | (2006.01) |

(52) U.S. Cl.
CPC ................ *B65G 47/30* (2013.01); *B65G 15/22* (2013.01); *B65G 47/29* (2013.01); *H01L 21/6776* (2013.01); *H01L 21/67706* (2013.01)

(58) Field of Classification Search
CPC ........... B65G 2511/20; B65G 47/8823; B65G 47/31; B65G 47/8807; B65G 47/26; B65G 47/30

USPC ............ 198/531, 459.6, 459.7, 460.1, 461.1, 198/468.9, 468.11
See application file for complete search history.

(56) References Cited

U.S. PATENT DOCUMENTS

| | | | | |
|---|---|---|---|---|
| 4,040,512 | A * | 8/1977 | Ness ........................... | 198/460.1 |
| 4,291,796 | A * | 9/1981 | Gebhardt .................... | 198/460.1 |
| 5,073,342 | A * | 12/1991 | Porte et al. ............... | 198/468.11 |
| 7,219,785 | B2 * | 5/2007 | Saito et al. ................. | 198/345.1 |

FOREIGN PATENT DOCUMENTS

| | | |
|---|---|---|
| DE | 9306597 U1 | 7/1993 |
| DE | 19645760 A1 | 5/1998 |
| DE | 102011075174 A1 | 11/2012 |
| WO | 9621576 A1 | 7/1996 |
| WO | 2006024460 A1 | 3/2006 |
| WO | 2013109900 A2 | 7/2013 |

* cited by examiner

*Primary Examiner* — James R Bidwell
(74) *Attorney, Agent, or Firm* — Shlesinger, Arkwright & Garvey LLP

(57) ABSTRACT

A conveyor device for the conveying workpieces, specifically circuit boards. The conveyor device is equipped with a primary and secondary conveyance for conveying the workpiece along a first or second partial path of the conveyance path. Workpieces are fed to the first partial path via the second partial path. Separators operate along the first partial path to separate one workpiece from a trailing workpiece. The Separators feature at least one spacer which can be moved and displaced by a control. After the workpiece passes the starting position, the spacer switches into an active mode, in which it is placed behind the workpiece and tracks it, thereby forming a minimum spacing between the workpiece and the trailing workpiece, and upon reaching the ending position, the spacer switches into an inactive mode, in which the spacer returns to the starting position.

18 Claims, 7 Drawing Sheets

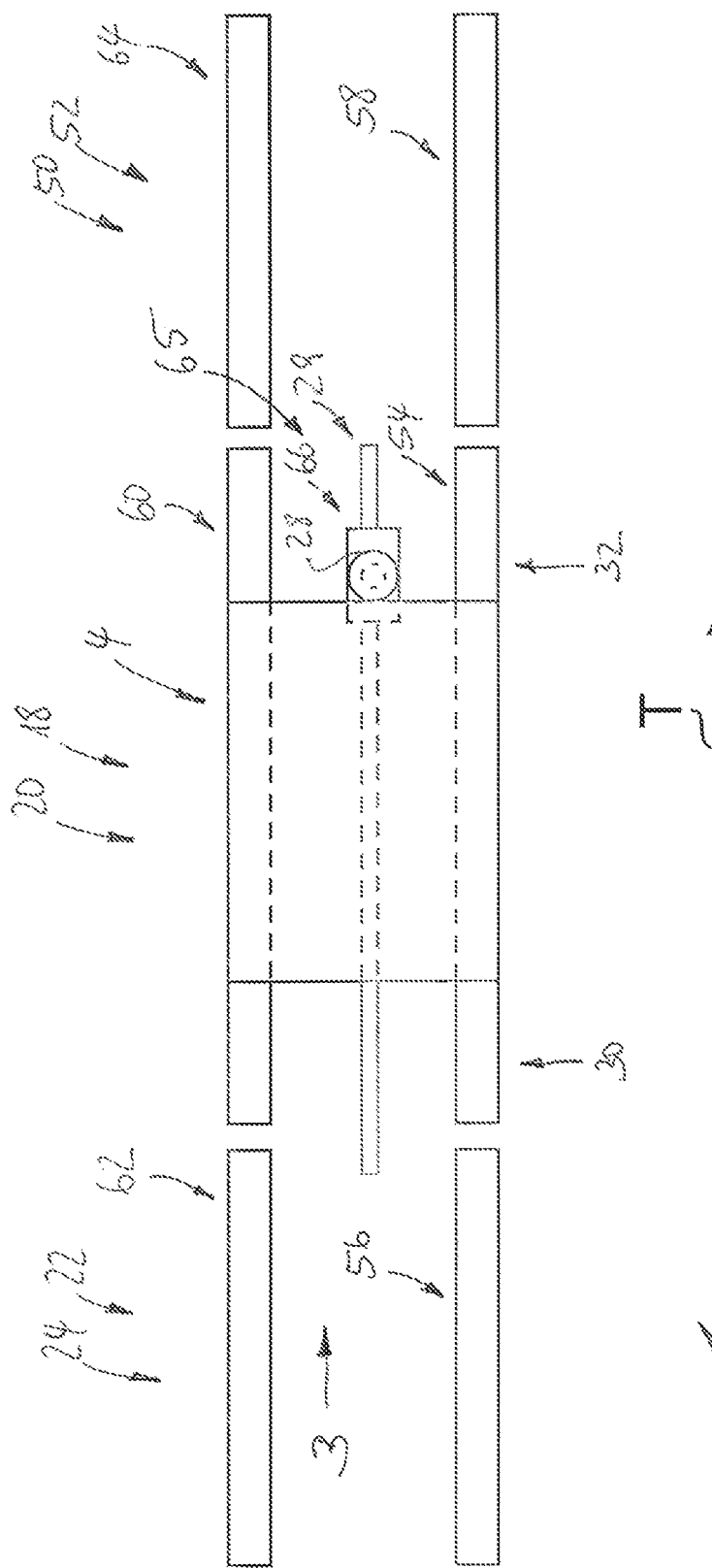

CONVEYOR DEVICE FOR THE CONVEYANCE OF WORKPIECES, SPECIFICALLY OF CIRCUIT BOARDS, IN THE CONVEYANCE DIRECTION ALONG A CONVEYANCE PATH

CROSS-REFERENCE TO RELATED APPLICATIONS

This application claims priority to German application number 10 2013 112 056.3 filed Oct. 31, 2013, and to European application number EP13005442 filed Nov. 20, 2013, both of which are entirely incorporated herein by reference.

FIELD OF THE INVENTION

The invention relates to a conveyor device for the conveyance of workplaces, specifically of circuit boards, in the conveyance direction along a conveyance path.

BACKGROUND OF THE INVENTION

Conveyor devices of the stated kind are used for different purposes and in different industries. For example, conveyor devices are used within a manufacturing line to convey workplaces from one processing station to another processing station. The conveyance path in a particular conveyor device in this activity is subdivided into partial paths, to which conveyance means are assigned, in order to convey a workplace in the conveyance direction along the partial path.

Conveyor devices of the stated kind are known from the state-of-the-art technology and first of ail feature primary conveyance means for workplace conveyance along a first partial path of the conveyance path. Furthermore, these conveyance devices feature secondary conveyance means for workpiece conveyance along a second partial path of the conveyance path. In this arrangement, the second partial path is positioned upstream, specifically immediately upstream, of the first partial path of the conveyance path in the conveyance direction, in order to feed workpieces to the first partial path. In this connection the expression "immediately upstream" is understood to mean that no additional partial path with conveyance means for workpiece conveyance is arranged between the first and second partial paths of the conveyance path.

However, the known conveyance devices of the stated kind present the inherent disadvantage that a deviation in the conveyance speeds of workpiece conveyance in the primary and secondary conveyance means will mean that either the geometric spacing between the workpieces in the conveyance direction becomes unreasonably large, or the workpieces may collide with each other and be damaged, especially in the transition region between first and second partial path. In this respect the known conveyance devices of the stated kind present the disadvantage of a lower workplace conveyance rate or the disadvantage of a high rejection rate for workpieces. The disadvantages mentioned result in loss of economical operation of a corresponding conveyance device.

One known solution to the problems is specified by the introduction of temporary storage for workpieces (buffer) to which workpieces are fed from the conveyance path if there is any danger that any spacing between workpieces lined up along the conveyance path will fall below the minimum, which could threaten collisions among them. The workpieces located in the workpiece temporary storage are fed to the conveyance path at a later time.

Furthermore, designs are known for more accurately synchronizing the partial paths with respect to their conveyance speed or combining them into one large conveyance path or to reduce the number of conveyance means.

OBJECTS AND SUMMARY OF THE INVENTION

The invention addresses the problem of specifying a conveyance device of the kind stated in the preamble to claim 1, which is configured and designed such that it enables an improvement in the conveyance of workpieces along a conveyance path subdivided into partial paths and at an increased workpiece conveyance rate.

The invention is independent of the idea of manipulating the conveyance means or of removing workplaces from the conveyance path to prevent a collision.

In addition, the invention rejects the idea of a redundant design of the conveyance path or partial paths of a conveyance path in order to prevent collisions between the workpieces or to increase the conveyance rate of workpieces.

Rather, the invention is based on the idea of realizing an improvement in conveyance of workpieces along a conveyance path by using simple means or little expense.

However, it rejects the idea of reducing the conveyance rate to a common low level in order to remedy the problem of collisions between the workpieces. Similarly, the invention refuses the notion of customizing the workpieces to be conveyed by design measures, thereby marking them resistant to collision damage or reinforcing them.

Rather, the invention solves the problem by inserting a spacer, at least temporarily, during the conveyance along at least one partial path, at least in some sections, between one workpiece and a workpiece trailing that workpiece in the conveyance direction, to separate the aforementioned workpieces in this way at a minimum distance from one another, for example, and specifically in an essentially mechanical manner.

To do so, the invention is independent of idea of specifying any fixed position of the workpieces in a kind of grid. Rather it follows the approach of being able to feed the workpieces optionally to at least one of the partial paths of the conveyance path while maintaining a minimum spacing between any two workpieces.

To solve the problem as laid out, the invention provides means of separation that operate at least in sections along the first partial path to separate one workpiece from a trailing workpiece in the conveyance direction. To do so, the means of separation feature at least one spacer that can be displaced in the conveyance direction between a starting position and a distant ending position in the conveyance direction, with its movement controllable by means of control, in such a manner that after the workpiece passes the starting position, the spacer switches into an active mode, in which it is placed behind the workpiece in the conveyance direction and tracks it, thereby forming a minimum spacing between the workpiece and the workpiece trailing it, and, upon reaching the ending position, switches into an inactive mode, in which the spacer returns to the starting position but without colliding with any of the workpieces (so that the spacer returns without collision to the starting position).

In the inactive mode, the spacer does not form a minimum spacing between one workpiece and the workpiece trailing that workpiece in the conveyance direction (so that a minimum spacing of the aforementioned workpieces from one another is eliminated).

As already described, in this respect the triggering event for activating the spacer to form the minimum spacing stated above, that is, the switch into active mode, is that the workpiece passes the starting position of the spacer. Accordingly, the terminating event for deactivation of the spacer, i.e., a switch of the spacer into inactive mode, is that the workpiece passes the ending position of the spacer.

Thus with the invention, the starting and ending positions of the spacer are defined so as to prevent a collision between the particular workpieces through formation of a minimum spacing between them along the first partial path. Specifically, for example, the starting and ending positions for the spacer are located correspondingly at the ends of the first partial path.

With the invention, the spacer is prevented from colliding with a workpiece in a collision-free operation.

With the invention, then, the advantage achieved, simply and effectively, is that a workpiece can be fed via the first partial path to the second partial path, without requiring precise calibration of the conveyance speeds between the conveyance means of the first and second partial paths of the conveyance path. In this respect, differences in the conveyance speeds or in the type of conveyance between the partial paths of the conveyance path, for example, a continuous or discontinuous, or to be precise, an intermittent conveyance, can be smoothed out simply and inexpensively while preventing collisions between the workpieces.

Thus the expense for synchronization of the partial paths of the conveyance path with each other is eliminated.

Furthermore, with the invention, the advantage emerges that a time delay is eliminated because, in the case of partial paths of the conveyance path, without the invention a workpiece can be fed only at a time when the partial path does not have any workpieces. By use of the invention, a workpiece can be fed subsequent to the workpiece already located on the partial path without a collision occurring between the workpieces.

Another advantage is that a sufficient minimum spacing is maintained between one workpiece and a workpiece trailing that workpiece in the conveyance direction, to prevent collisions between the workpieces. Hence the spacer prevents an undesired approach of one workpiece to another workpiece in the conveyance direction, specifically to a workpiece placed immediately behind, so that a minimum spacing remains assured between the aforementioned workpieces.

Furthermore, with the invention, in addition to the financial advantages in workpiece conveyance, maintenance of a conveyance device with the invention can be accomplished inexpensively with little time expenditure.

Within the meaning of the invention, with respect to the spacing of workpieces from each other, the expression "placed immediately behind" is understood to mean that no additional workpiece to be conveyed is arranged in the conveyance direction between the workpieces involved.

Furthermore, within the scope of the invention, a workpiece is to be understood as a one-piece component made of one part or even several parts. In this respect, a component can also consist of several parts, or even modules. Therefore within the meaning of the invention, a component can also be a kind of circuit board, which in turn can be populated, or also unpopulated with components, and likewise encompasses so-called wafers or semiconductors.

The invention is particularly relevant in the case of comparatively low-weight workpieces, since they tend toward slippage, so that a difference results between speed of workpiece conveyance generated by the conveyance means, namely the conveyor speed, and the speed of the workpiece in the conveyance direction. The slippage noted above promotes an undesired approach of sequential workpieces toward one another, which in turn leads to an increased risk of collision.

In terms of the invention, the term "processing station" is understood to mean a set-up or device whose functional scope includes the testing or processing of a workpiece. Accordingly, in terms of the invention, the processing of a workpiece is not necessarily aimed at any modification of the workpiece.

Furthermore, the descriptions of the invention always relate to the conveyance device using the invention in an operating state, in which it is deployed for the specified purpose and can be used or actually is used for said purpose. Any differences therefrom are indicated by explicit statements or through the pertinent meaning relationship.

A conveyance direction with the invention is to be understood as the direction of workpiece conveyance in which the workpieces are conveyed to their intended destination along the conveyance path from the beginning or a conveyance path to the end of a conveyance path. Conveyance in a direction opposite to the conveyance direction is indeed covered with the invention, but such conveyance is not explicitly discussed hereinafter.

Furthermore, the control function also encompasses the control means in terms of the invention. Implementation of the control means herein can take place both mechanically and, preferably, by signal engineering, i.e., by electrical/electronic means (as well as in a combination of the embodiments mentioned), wherein the corresponding components are connected to means of control by control engineering or signaling technology, without this being explicitly described.

Control as exercised by the control means can take place, for example, specifically with the assistance of an actuator or drive unit, which in turn can feature an electrically powered drive motor to generate a propulsion movement for the controller, to cause a change in mode or state. However, a propulsion movement can likewise be effected through hydraulic or pneumatic actuators/components.

Furthermore, it is possible to use a mechanical or kinematic control that is, for example, specifically event-controlled.

For various reasons it may be necessary for the conveyance of a workpiece to proceed intermittently along at least one partial path of the conveyance path, due to conveyance interruptions or due to occasional variation of the conveyance speed, specifically, for example, to perform processing on the workpiece, primarily some testing of the workpiece.

In this regard, one favorable improvement of the invention provides that the workpiece conveyance is intermittent, at least via the primary conveyance means, in which—when the workpiece conveyed by the primary conveyance means reaches a standby position in which a processing station, in particular a test station, processes or tests the workpiece in a processing time period—the conveyance of the workpiece in the conveyance direction during the processing time ceases or proceeds at a changed, in particular lesser, conveyance speed of the workpiece.

The advantage attained thereby is that a processing or testing of a workpiece need not be adapted to a constant conveyance speed, or the conveyance speed along the entire conveyance path or at least along one of the partial paths of the conveyance path does not have to be calibrated to the processing or test station. Furthermore, redundant design of processing and test stations is not required.

Workpiece conveyance along a conveyance path or along a partial path of the conveyance path can be implemented in various ways. For example, it is specifically possible to provide linear guides to form the stated conveyance or partial paths. Along with this, it is possible to convey the workpieces on an air cushion formed underneath them. Furthermore, in addition to air or fluid-based designs, both magnetic and induction-based designs are covered by the invention.

An additional favorable refinement of the invention further provides that at least the primary conveyance means are designed as a kind of steady conveyor, and feature in particular at least one conveyor belt that is preferably endless, which performs a conveyance movement for workpiece conveyance by a rotational movement around at least two rollers, specifically with parallel axes, separated from each other in the conveyance direction. For instance, a conveyor belt, specifically, is set up, designed such that especially in the case of an essentially horizontal alignment of the conveyor belt, a conveyance surface for the workpiece is formed on the surface directed outward in vertical direction, upon which the workpiece can be positioned, directly or indirectly for its conveyance, by the use of a support, for example.

Both contact-sensitive workpieces and workpieces that require essentially free access to their top side or to their underside for processing or testing, can be conveyed by means of their outer edges, for example, or their outer edge regions.

To do so, the invention provides another favorable refinement such that at least the primary conveyance means feature at least one first conveyor belt, specifically one that is endless, and at least one second conveyor belt, specifically one that is endless, positioned at an angle thereto at a distance, whose respective revolving movements are synchronized with one another for workpiece conveyance. The workpiece conveyance occurs therein according to the principles described above.

To obtain the most compact design possible, an additional favorable improvement of the invention provides that the spacer is arranged at least in its active mode at an angle to the conveyance direction between the first and the second conveyor belts, in particular is equally spaced from the conveyor belts.

An arrangement of the spacer, at equal distance from the conveyor belts at an angle to the conveyance direction directly neighboring the spacer, makes it possible to design the spacer in a simply constructed design, and in addition, an undesirable movement of the workpiece is prevented, both relative to the conveyance path, in particular, and also to the directly trailing workpiece, specifically at an angle to the conveyance direction.

A design simplification of the propulsion drive of the spacer to provide movement in the conveyance direction can be obtained by synchronizing the movement of the spacer, at least in its active mode, with the workpiece conveyance of the primary conveyance means. In this regard it is also possible to link the drive of the spacer advantageously with the drive of the conveyance means or to control its movement based on the workpiece conveyance of the conveyance means. This will provide the advantage that any contact of the spacer, for example, with specifically collision-sensitive workpieces will remain limited to exceptional cases that occur under the slippage conditions mentioned above.

Following the idea of the invention that the shortest path between two points is a straight line, one favorable refinement of the invention provides that the means of separation feature at least one linear guide, through which the spacer is guided for movement between starting position and ending position. Accordingly, the advantage the invention offers for short movement paths or displacement paths of the spacer is achieved. Furthermore, a low-cost implementation can be undertaken, since standard or off-the-shelf components can be used.

In this regard, likewise advantageously, the invention takes account of the fact that a collision between two workpieces can occur when one workpiece displays slippage with respect to the workpiece conveyance, so that spacing between two workpieces may fall below the minimum, which makes a collision likely. In this regard an active drive of the spacer to move in the conveyance direction or between the starting and ending positions can contribute to correction of a slip-related delay in conveyance of the workpiece, so as to maintain a minimum spacing in the conveyance direction between the workpieces, since the spacer touches the particular workpiece or makes mechanical contact with it and then moves it or drives it in the conveyance direction. Furthermore, this prevents any undesired, irregular workpiece conveyance (e.g., fluctuations in conveyance speed) from leading to collision of the workpieces.

To prevent collision problems of this kind, the invention provides that the spacer causes a minimum spacing to be maintained between one workpiece and a workpiece trailing that workplace in the conveyance direction.

Within the scope of the invention it should be taken into consideration that the means of separation, specifically electrically operated means of separation, feature means of propulsion for generating movement of the spacer in the conveyance direction, specifically between starting position and ending position. The means of propulsion can be connected to means of control by control engineering or by signaling technology to be able to better regulate, direct, or control any propulsion movement for the spacer and to coordinate with the desired workpiece conveyance.

Placement of a spacer into the movement path of the workpieces mentioned above to form a minimum spacing can proceed in various ways with the invention.

Within the scope of the invention a workpiece is moved by the conveyance means along a movement path whose extent in the conveyance direction is defined by the conveyance path or by the partial paths of the conveyance path, and whose further spatial dimension is defined by the dimensions of the particular workpiece.

The invention in its scope provides a pivot device, for example, as an actuator, through which the spacer can be moved. The spacer herein is arranged at the actuator such that the latter pivots by means of a pivot motion around a pivot axis in active mode into the movement path of the workpieces mentioned above on the first partial path, at least, to form a minimum spacing between the workpieces mentioned and is pivoted out in the inactive mode by a pivot motion away from the motion path.

In this regard the actuator in its simplest design can feature a guide rod on which the spacer extends in a direction radial to the longitudinal axis of the guide rod and is coupled to the motion rod such that a first pivot motion of the guide rod around its longitudinal axis causes the spacer to pivot into the movement path of the workpieces, forming the minimum spacing mentioned above in the active mode, and a second pivot motion causes a pivot of the spacer out of the movement path of the workpieces, so that the formation of the minimum spacing by the spacer will cease.

For its movement, in the conveyance direction relative to the guide rod noted, the spacer can be moved or can be linked to the movement by means of the guide rod, such that a movement of the guide rod in the conveyance direction will likewise cause a corresponding movement of the spacer in the conveyance direction to produce a movement between starting and ending position of the spacer.

In view of the above-referenced possible implementation that incorporates a spacer into the movement path of the particular workpiece, another favorable refinement of the invention provides that the means of separation feature at least one actuator that moves the spacer—to establish a minimum separation between the workpiece and the workpiece placed behind it in the conveyance direction—into the movement path of the workpiece, at least in sections, and when the ending position is reached, moves it out of the movement path of the workpiece in vertical position for a movement of the spacer from the ending position into the starting position.

In this respect, an actuator with the invention also acts, among other things, as a means of propulsion to convert control signals from the means of control into a movement of the spacer, or to generate these signals. Accordingly, an actuator is designed, for example, specifically as an electromechanical drive such as a hoisting/lowering or position-adjustment system.

To be able to return the spacer without collision in the conveyance direction from the ending position back to the starting position, an additional favorable refinement of the invention takes into account another embodiment for the aforementioned variant to create an actuator that features at least one hoisting/lowering device for the spacer, which hoists the spacer in the active mode by means of a hoisting movement in the vertical direction to form minimum spacing of the workpieces, and when the ending position is reached, to lower the spacer in vertical direction from the ending position into the starting position, out of the movement path, specifically underneath the trailing workpiece.

The invention achieves particular advantages through the use of a processing station. Thus in particular in another favorable refinement of the invention a processing station is provided for workpiece processing with at least primary conveyance means for workpiece conveyance along a first partial path of the conveyance path to which a second partial path of the conveyance path feeds workpieces for conveyance through the primary conveyance means.

A processing station according to the invention uses the invention components of the above-specified conveyance device with the invention, and accordingly is characterized by means of separation that operate at least in sections along the first partial path of the conveyance path to separate one workpiece from a workpiece trailing in the conveyance direction, wherein the means of separation feature at least one spacer which can be displaced in the conveyance direction between a starting position and a distant ending position in the conveyance direction, and is controllable by control means in such a manner that after the workpiece passes the starting position the spacer switches into an active mode in which it is placed behind the workpiece in the conveyance direction and tracks it, thereby forming a minimum spacing between the workpiece and the trailing workpiece, and upon reaching the ending position, switches into an inactive mode and returns to the starting position.

In this regard, as already described above, the triggering event for activating the spacer to form the aforementioned minimum spacing, that is, the switch to active mode, is defined as the workpiece passing the starting position of the spacer. Accordingly, the terminating event for deactivation of the spacer, that is, a switch of the spacer into inactive mode, is the workpiece passing the ending position of the spacer.

According to the invention, the starting and ending position of the spacer are defined such that any collision between the stated workpieces is prevented through the formation of minimum spacing between them along the first partial path. For example, the starting and ending positions specifically are arranged correspondingly at the ends of the partial path.

The invention can be characterized based on the above-mentioned, favorable embodiments.

The invention will be described in greater detail below based on the attached drawings, which illustrate one sample embodiment of a conveyance device with the invention for the conveyance of workpieces, specifically circuit boards, in the conveyance direction along a conveyance path (hereinafter also abbreviated as the conveyance device). The invention will be described based on the figures together with an application of the invention at a processing station.

In this, all features claimed, described, and represented in the drawings, whether individually or combined in any way, form the object of the invention, independent of their summary in the patent claims and their back-references and also independent of their description or depiction in the drawings.

The figures in the drawings show the sample embodiment of a conveyance device per the invention each in a schematic representation, wherein the invention is not restricted to this embodiment.

The depictions are neither drawn to scale and are not true to detail, but are rather reduced for a better overview of the constituents or elements that enhance understanding.

DETAILED DESCRIPTION OF THE INVENTION

The same or corresponding components/constituents or elements are indicated in the figures by the same reference numbers. For reasons of enhanced viewing, not all reference numbers are always entered in the figures. A correspondence between the relevant components/constituents or elements, however, is indicated by the same mode of representation or by a depiction corresponding to the particular view.

Figure 1:
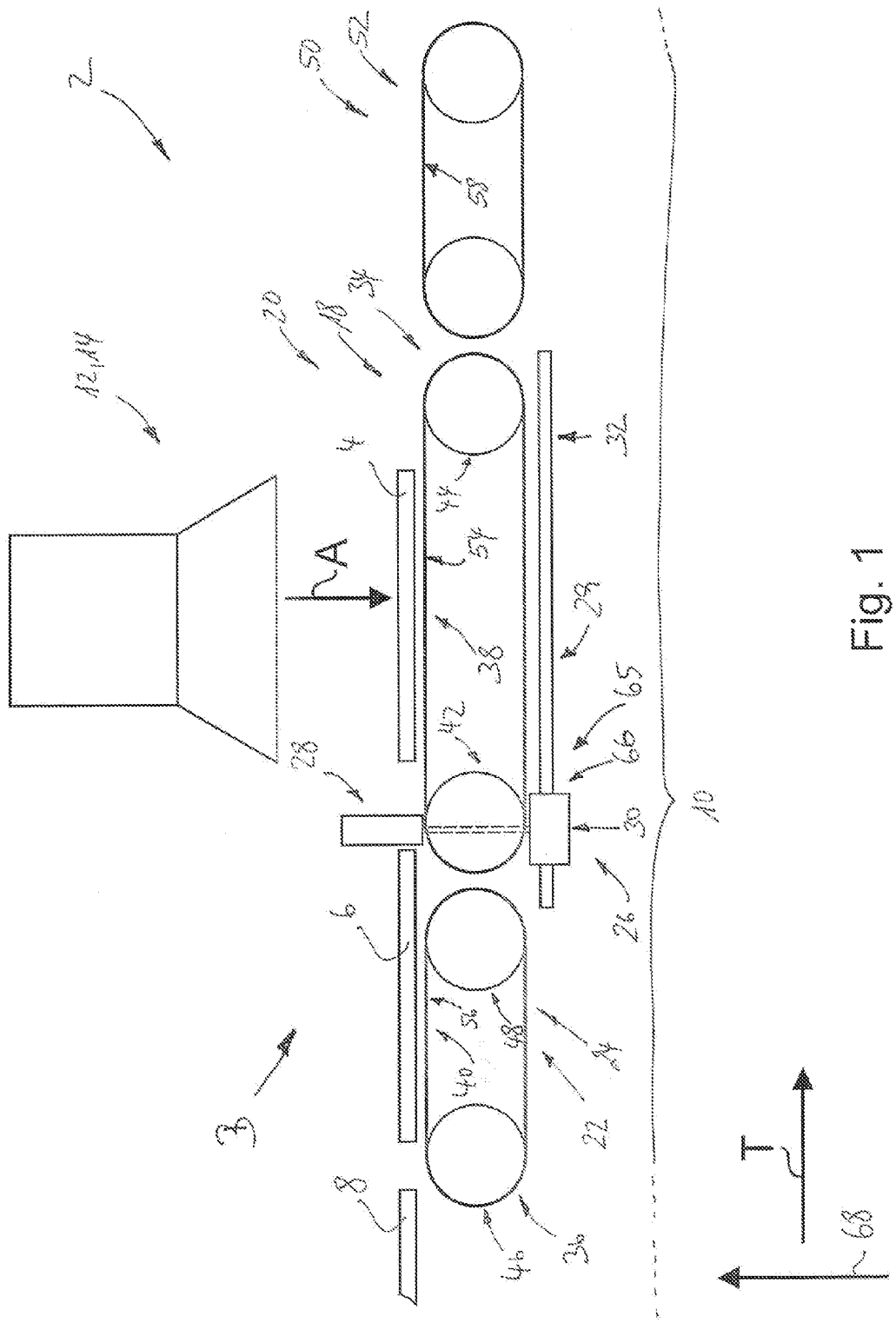
FIG. 1 The sample embodiment of a conveyance device per the invention based on an initial operating phase, presented in schematic representation with side view, FIG. 2 The sample embodiment from FIG. 1 of a conveyance device per the invention based on a second operating phase, using the same schematic representation as in FIG. 1, FIG. 3 The sample embodiment from FIG. 1 of a conveyance device per the invention based on a third operating phase, using the same schematic representation as in FIG. 1, FIG. 4 The sample embodiment from FIG. 1 of a conveyance device per the invention based on a fourth operating phase, using the same schematic representation as in FIG. 1, FIG. 5 The sample embodiment from FIG. 1 of a conveyance device per the invention based on a fifth operating phase, using the same schematic representation as in FIG. 1, FIG. 6 The sample embodiment from FIG. 1 of a conveyance device per the invention based on a second, operating phase, using the same schematic representation as in FIG. 1, which is equivalent to the initial operating phase depicted in FIG. 1, FIG. 7 The sample embodiment from FIG. 1 of a conveyance device per the invention, shown in schematic depiction in a view indicated in FIG. 1 by "A".

FIG. 1 shows one embodiment of a conveyance device 2 with the invention (hereinafter also abbreviated as conveyance device 2) for conveyance of workpieces 4, 6, 8, specifically of circuit boards, in the conveyance direction T along a conveyance path 10.

The conveyance device 2 or the conveyance path 10 is a constituent of a production line (not depicted) and thus feeds the particular workpieces 2, 4, 6 to the processing stations 12 for processing.

With the invention, a processing station 12 also encompasses the functions of a test station 14 for workpiece testing.

The processing station 12 depicted in FIG. 1 is used for testing of circuit boards in their specific design as wafers 4, 6, 8. The test of a wafer 4, 6, 8 takes place by means of an optical test system 16 in this embodiment of the invention. The data acquired from the test are evaluated by an evaluation system corresponding to the specifications in order to ascertain the quality of the workpiece 4, 6, 8 or of the wafer 4, 6, 8. The above-referenced constituents without reference numbers are not illustrated.

The conveyance device 2 is equipped with primary conveyance means or conveyor 18 for conveyance of the workpiece along a first partial path 20 of the conveyance path and with a secondary conveyance means or conveyor 22 for conveyance of the workpiece along a second partial path 24 of the conveyance path 10, which is arranged immediately in front of the first partial path 20 in the conveyance direction in order to feed workpieces 4, 6, 8 to the first partial path 20.

The conveyance device 2 is characterized in that it features means of separation or separator 26, which are used to separate a workpiece or one workpiece or a first upstream workpiece 2, 4 from a workpiece or a second or trailing downstream workpiece 4, 6 directly following in the conveyance direction T, at least in sections along the first partial path 20 of the conveyance path 10.

To do so, the means of separation 26 feature a spacer 28 which can be moved in the conveyance direction T between a starting position 30 and an ending position 32, located, at a distance therefrom in the conveyance direction T, and can be controlled by a means of control (not depicted), to which they are connected by control engineering or by signaling technology, in such a manner that the spacer 28, after the workpiece 4, 6, 8 passes the starting position 30, is switched into an active mode in which it trails the workpiece 4, 6, 8 in the conveyance direction T and thereby forms a minimum spacing between the workpiece 4, 6 and the following workpiece 6, 8, and once the ending position 32 is reached, switches into an inactive mode in which the spacer 28 returns to the starting position 30.

In this sample embodiment of the invention, the spacer 28 forms the minimum spacing in a purely mechanical manner or by its geometric dimensions, in that the constituent of the spacer 28 by which it makes mechanical contact with the workpiece 2, 4 or with the following workpiece 4, 6 to form a minimum spacing, is defined by its dimension in the conveyance direction T. The stated mechanical contact, i.e., touching a workpiece 4, 6, 8, takes place at least by means of one section of the spacer (28).

The determination of the minimum spacing by the spacer 28, however, can also take place electronically or with a combination of electronic or mechanical spacing of the above-mentioned workpieces 4, 6, 8.

It is possible herein that any contact of the spacer 28 with the workpiece 4, 6, 8 is avoided, since the spacer 28 follows the workpiece 4, 6, 8 without contact in the conveyance direction T in active mode. Any contact with the workpiece 4, 6, 8 is restricted essentially to those cases when slippage occurs between the movement of the workpiece 4, 6, 8 in the conveyance direction T and the actual workpiece conveyance, especially by the primary conveyance means, or when a collision is threatened between the workpieces 4, 6, 8, meaning the workpiece 6, 8 that trails the workpiece 4, 6, 8 in the conveyance direction approaches too close. The situation is analogous to an instance of a failure of the workpiece conveyance 4, 6, 8 due to the primary conveyance means 18.

The spacer herein is guided by a linear guide 29 for a movement in the conveyance direction (T) between a starting position 30 and an ending position 32.

This kind of tracking of the spacer 28 can thus be based on a sensor (not depicted) that detects the individual positions of the spacer 28 and workpiece 4, 6, 8, and the control means (not depicted) accordingly controls the movement of the spacer 28.

In order to test the workpiece 4, 6, 8 at the processing or testing station 12, 14, the conveyance of the workpiece 4, 6, 8 by the primary conveyance means 18 must cease. Accordingly, the conveyance of the workpiece 4, 6, 8 takes place on a discontinuous and hence intermittent basis. To do so, the conveyance device 2 provides that the workpiece conveyance occurs on an intermittent basis, at least by the primary conveyance means 18, wherein the conveyance of the workpiece 4, 6, 8 by the primary conveyance means 18 ceases upon reaching a stopping position (in FIG. 1, the workpiece 4 is in such position), in which the test station 16 tests the workpiece 4, 6, 8 during a processing interval, and thus the conveyance of the workpiece 4, 6, 8 in the conveyance direction T ceases during the processing time.

Furthermore, the conveyance device 2 provides that both the primary conveyance means 18 and the secondary conveyance means 22 are each designed as a kind of steady conveyor 34, 36, and each features at least one conveyor belt 38, 40, specifically one that is endless.

Accordingly, a conveyance motion for workpiece conveyance takes place for each of the conveyor belts 38, 40 by at rotating movement about two rollers 42, 44, 46, 48 with parallel axes, separated in the conveyance direction T.

A third conveyance path 50 of the conveyance path 10 is arranged downstream of the first partial path 20 of the conveyance path 10 in the conveyance direction T to which workpieces 4, 6, 8 are fed via the first partial path 20.

To do so, the conveyance device 2 provides for third conveyance means 52 for workpiece conveyance along the third partial path 50 of the conveyance path 10, which is directly downstream of the first partial path 20 in the conveyance direction T, wherein the latter feeds the workpieces 4, 6, 8 to the first partial path 20 for further workpiece conveyance.

Furthermore, the conveyance device 2 is characterized in that the primary conveyance means 18 and the secondary conveyance means 24, and also the third conveyance means 54, each features a first endless conveyor belt 54, 56, 58, and a second endless conveyor belt 60, 62, 64, separated at an angle to the conveyance direction T, whose particular, rotating motion of the conveyance belts serve for workpiece conveyance through the particular conveyance means 18, 22, 62, which are correspondingly calibrated to each other or are synchronized with each other.

The arrangement is illustrated schematically in FIG. 7.

The spacer 28 in the conveyance device 2 depicted in FIG. 1 is arranged in its active mode and also in its inactive mode at an angle to the conveyance direction T between the first and the second conveyor belt 54, 56 of the primary conveyance means 18 and is equidistance from it.

Thus a compact design of the conveyance device 2 is possible. Furthermore, an arrangement of this kind does not unduly restrict the permissible height or width of the fed workpieces 4, 6, 8.

For a coordination of the movement of the spacer 28 to the workpiece 4, 6, 8, which it follows in active mode, the invention provides that the movement of the spacer 28 in active mode is synchronized with the workpiece conveyance of the primary conveyance means 18.

In addition, the invention provides that the means of separation 26 feature electrically operated propulsion means (not depicted) for generating of a movement of the spacer 28 between starting position 30 and ending position 32, in order for the spacer 28 to track the particular workpiece 4, 6, 8 through a corresponding propulsion movement and after reaching the ending position 32, to move back into the starting position 30.

For this purpose the propulsion means are connected to the control means (not depicted) of the conveyance device 2 by means of signaling technology, which, among other things, controls the movement of the spacer 28. The control means are also used to ascertain whether a workpiece has passed the starting position 30 for the spacer 23 or its ending position 32. To do so, the means of control feature sensors connected to it by control or signal technology. The sensors can be used, among other things, to sense the movement of workpieces (4, 6, 8) past the specified positions (30, 32) or to detect when the means of control are able to initiate corresponding actions or can control corresponding components. The aforementioned constituents without reference numbers are not illustrated in the Figures.

In order for the spacer 28 to track the workpiece 4, 6, 8 to form a minimum spacing to a following workpiece 6, 8, the invention provides that the means of separation 26 feature at least one actuator 65, which moves the spacer 28 in active mode into at least sections of the movement path B of the workpiece 4, 6, 8 to form a minimum spacing between the workpiece 4, 6, 8 and the workpiece 6, 8 following in the conveyance direction T, and once the ending position is reached, moves vertically 68 out the movement path B of the workpiece 4, 6, 8 in order to move the spacer 28 from the ending position 32 into the starting position 30.

To do so, the actuator 65 features at least one hoisting/lowering device 66 for the spacer 28, which hoists the spacer 28 vertically 68 in active mode by means of a hoisting motion to form a minimum spacing of the workpieces 4, 6, 8, and then when reaching the ending position 32, vertically 68 descends for a movement of the spacer 28 from the ending position 32 into the starting position 30 out of the movement path B into a collision-free region, in particular beneath the following workpiece 6, 8.

In a collision-free region according to the invention the spacer 28 is prevented from colliding with a workpiece 4, 6, 8.

FIG. 1 shows the conveyance device 2 in a first operating phase in which the workpiece 4, which is fed to the test station 16 along the first partial path 20 of the conveyance path 10, is subjected to a test.

Thus the spacer 28 is illustrated in an active mode in FIG. 1 in which the spacer 28 is directly following the workpiece 4 in the conveyance direction T, and is arranged between it and a workpiece 6 directly following the workpiece 4 in the conveyance direction T.

Thus the spacer 28 is arranged between the aforementioned workpieces 4, 6, 8 in a contact-free manner. The spacer 28 has been hoisted by the hoisting/lowering device 66 after the particular workpiece 2, 4, 6 has passed the starting position 30 for the spacer 28.

Figure 2:
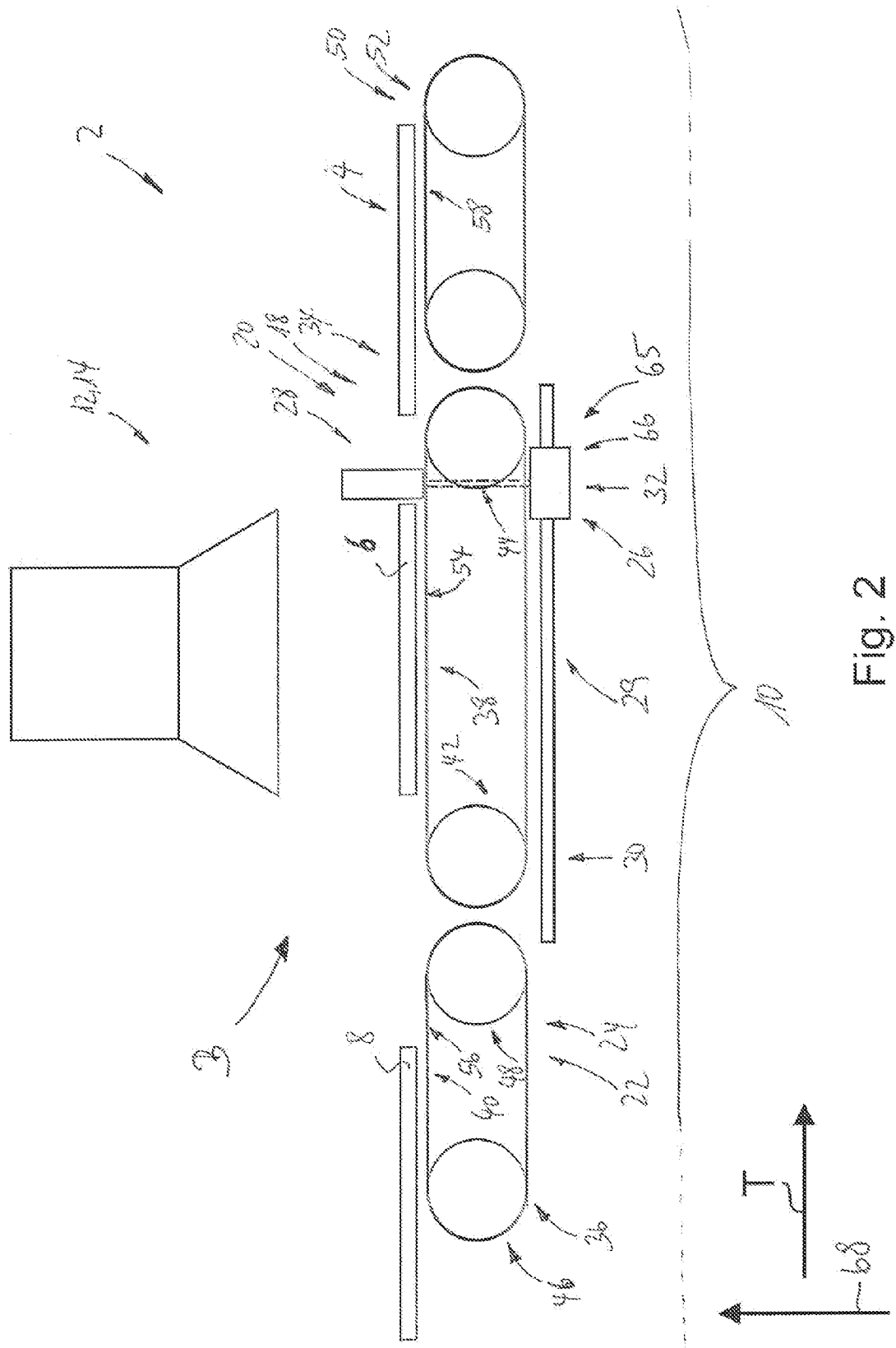
Figure 3:
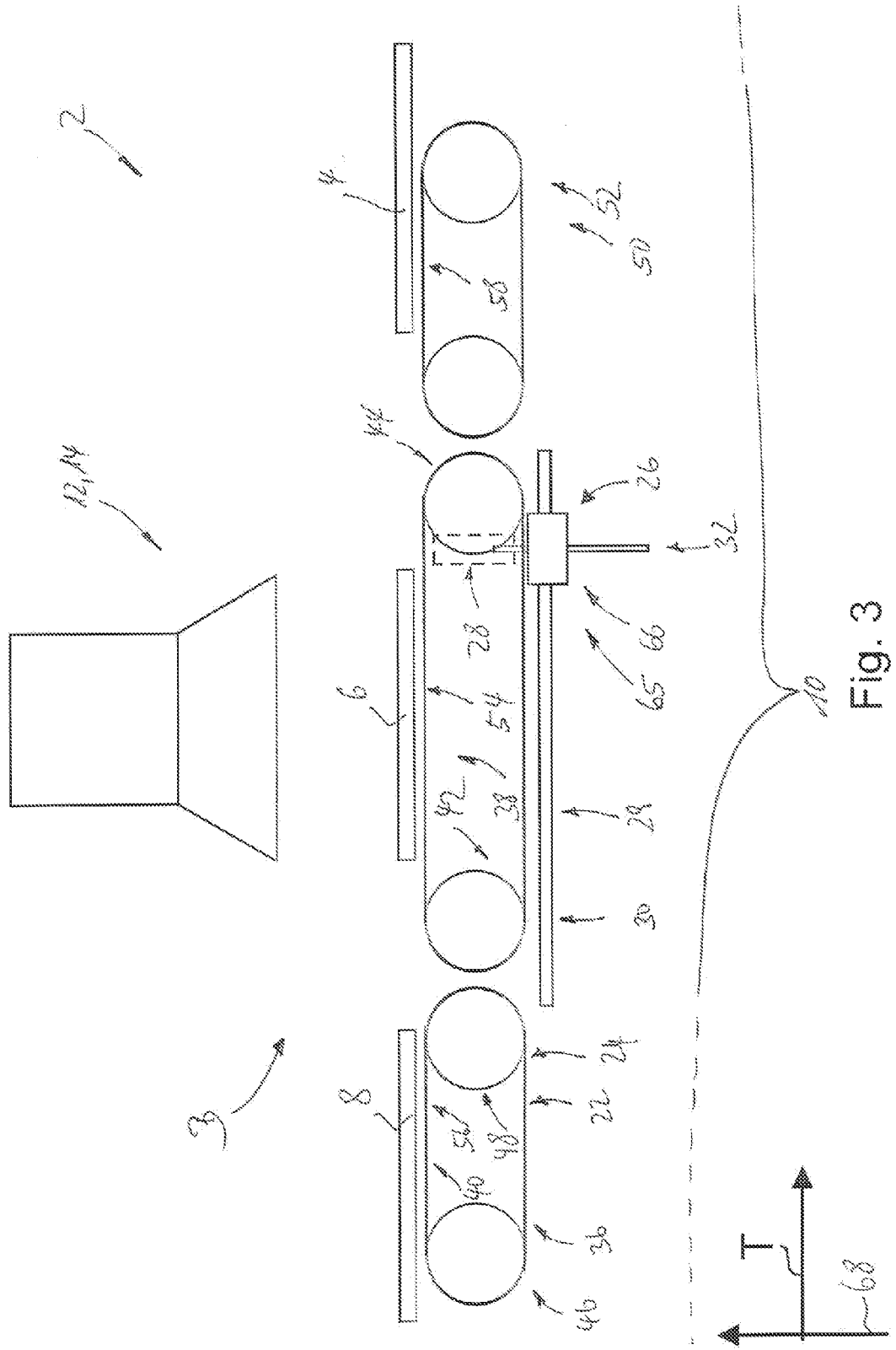
Figure 4:
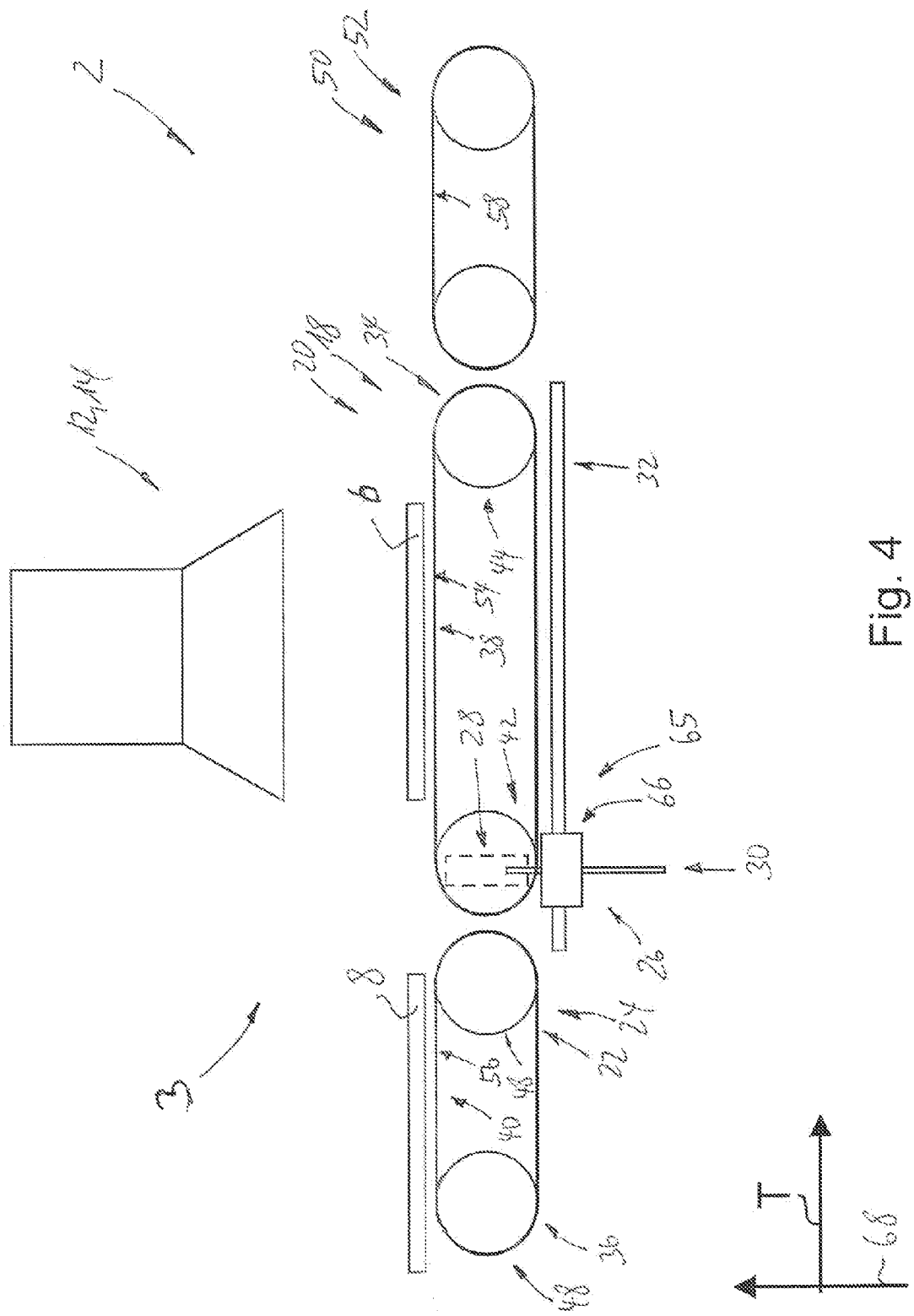
Figure 5:
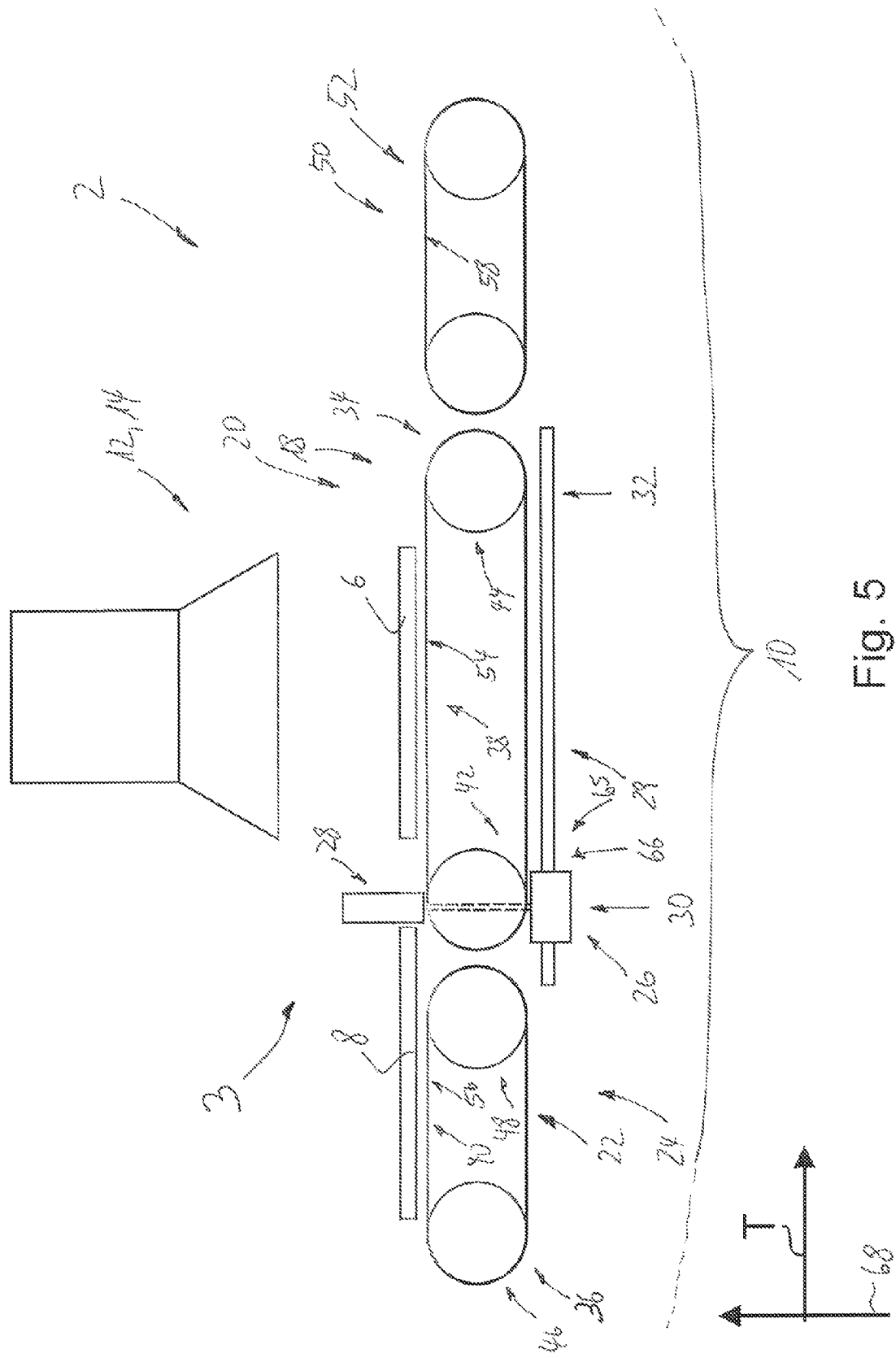

FIG. 2 illustrates the conveyance device 2 from FIG. 1 in a second operating phase. In this figure the workpiece 4, 6, 8 is conveyed in the conveyance direction T by the primary conveyance means 18 and fed to the third conveyance path 52. The spacer 28 moves in the direction of its ending position 32. The workpiece 6, 8 directly following the workpiece 4, 6, 8 in the conveyance direction T is fed to the first partial path 20 via the second partial path 24 and is conveyed along the first partial path 20 by means of the primary conveyance means 18. Thus the workpiece 4, 6, 8 reaches a standby position and the spacer 28 reaches its ending position 32 in which it is lowered by the hoisting/lowering device 66 downward in a vertical direction 68 and is returned to its starting position 30. This process is depicted in FIG. 3 and FIG. 4 based on a third or fourth operating state of the conveyance device 2. Next, the spacer 28 is hoisted by the hoisting/lowering device 66 in the vertical direction 68 to form anew a minimum spacing for the workpiece 6 following the previously mentioned workpiece 4, as is shown based on a fifth operating state of the conveyance device 2 in FIG. 5.

Figure 6:
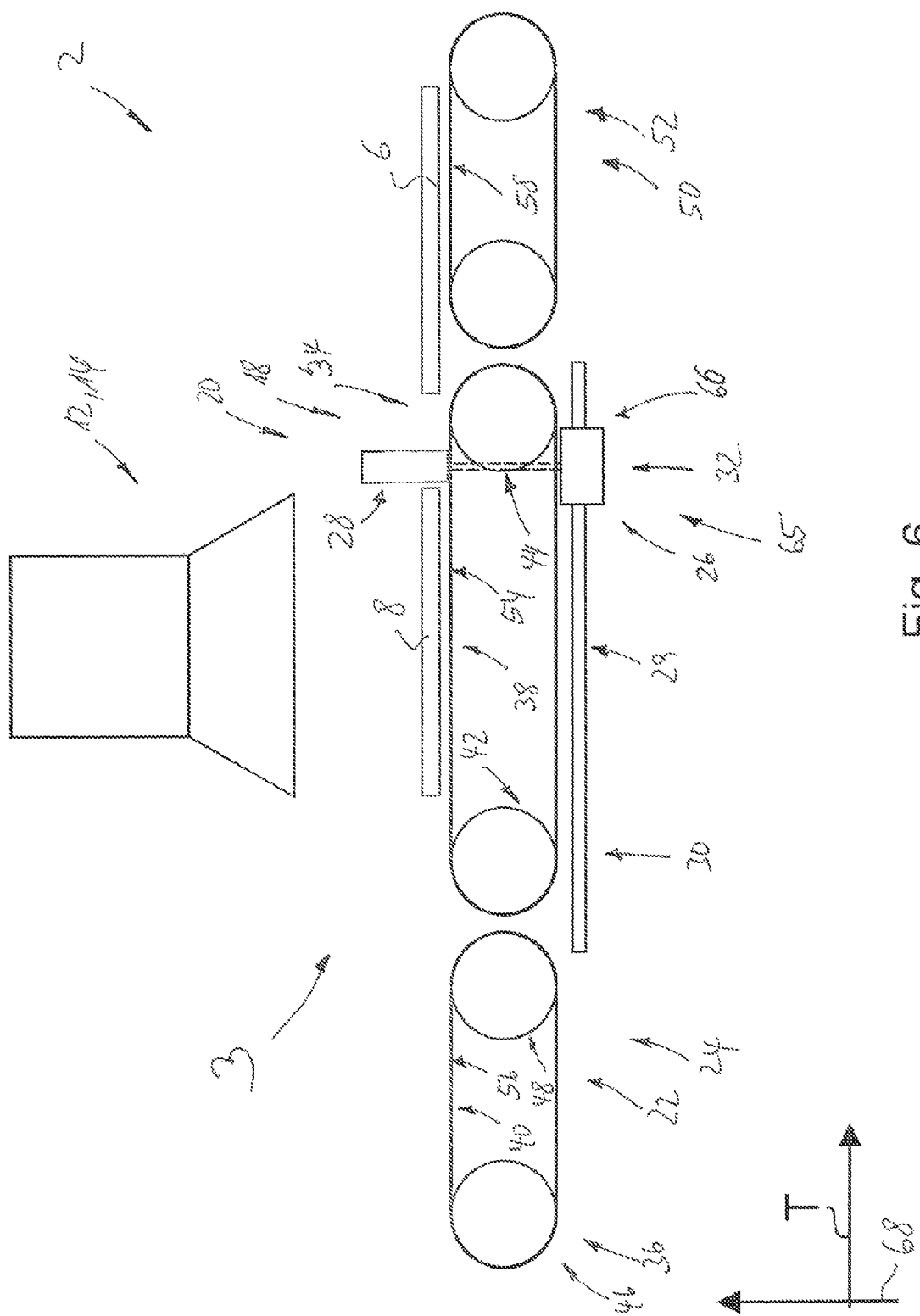

FIG. 6 shows a sixth operating state of the conveyance device 2 which is equivalent to the first operating state shown in FIG. 1.

To illustrate the implementation of the aforementioned conveyance means 18, 22, 52, the view denoted as "A" in FIG. 1 is shown again in FIG. 7.

The invention likewise can have its previously disclosed constituents used in a redundant manner.

The invention claimed is:

1. A conveyor device for the conveyance of workpieces in a conveyance direction from downstream to upstream along a conveyance path, comprising:
   primary conveyance means for conveyance of the workpiece along a first partial path of the conveyance path;
   secondary conveyance means for conveyance of the workpiece along a second partial path of the conveyance path, which is placed downstream of the first partial path in the conveyance direction in order to feed workpieces to the first partial path; and
   means of separation that operate along the first partial path, at least in sections, to separate a first workpiece from a downstream trailing workpiece trailing that first workpiece in the conveyance direction,
   wherein the means of separation feature at least one spacer which can be displaced in the conveyance direction between a downstream starting position and a distant ending position in the conveyance direction and is controllable by control means in such a manner that after the first workpiece passes the starting position the spacer switches into an active mode in which it is placed downstream from and behind the first workpiece in the conveyance direction and tracks the first workpiece in the conveyance direction, thereby forming a minimum spacing between the workpiece and the trailing workpiece in the conveyance direction, and upon reaching the ending position, switches into an inactive mode in which the spacer returns in the downstream direction to the starting position.

2. The conveyor device according to claim 1, wherein the workpiece conveyance is intermittent, at least through the primary conveyance means, the conveyance of the workpiece by the primary conveyance means, upon reaching a stopping point in which a processing station, processes or tests the workpiece in a processing period, suspends the conveyance of the workpiece in the conveyance direction during the processing period or occurs with a changed conveyance speed of the workpiece.

3. The conveyor device according to claim 1, wherein at least the primary conveyance means are designed as a kind of steady conveyor, and feature in particular at least one, preferably endless, conveyor belt which creates a conveyance movement for the workpiece conveyance by means of a rotational movement around at least two in particular axis-parallel rollers positioned at a distance from each other in the conveyance direction.

4. The conveyor device according to claim 3, wherein at least the primary conveyance means feature at least one initial endless conveyor belt, specifically one that is endless, and at least one secondary endless conveyor belt, positioned at a distance thereto and at an angle to the conveyance direction, the respective movements of which are calibrated to each other for the conveyance of the workpiece.

5. The conveyor device according to claim 1, wherein the spacer is arranged, at least in its active mode, at an angle to the transport direction between the first and the second conveyor belt, specifically, equally spaced from the conveyor belts.

6. The conveyor device according to claim 1, wherein the movement of the spacer in the active mode is coordinated with or synchronized with the workpiece conveyance by the primary conveyance means.

7. The conveyor device according to claim 1, wherein the means of separation feature at least one linear guide through which the spacer is guided for a movement between the starting position and the ending position.

8. The conveyor device according to claim 1, wherein the means of separation feature, electrically operated propulsion means to create a movement of the spacer between the starting position and the ending position.

9. The conveyor device according to claim 1, wherein the means of separation feature at least one actuator, which shifts the spacer into the movement path of the workpiece, at least in sections, and when the ending position is reached, shifts the spacer in the vertical direction out of the movement path of the workpiece to move the spacer from the ending position into the starting position, and the spacer forms a minimum spacing between the workpiece and the trailing workpiece in the conveyance direction.

10. The conveyor device according to claim 9, wherein the actuator features at least one hoisting/lowering device for the spacer, which hoists the spacer in the active mode by means of a hoisting movement to form minimum spacing of the workpieces in the vertical direction, and, when the ending position is reached, to lower the spacer from the ending position into the starting position, out of the movement path in vertical direction, specifically underneath the trailing workpiece.

11. A processing station for processing of a workpiece with at least a primary conveyance means for workpiece conveyance along a first partial path of a conveyance path, which feeds the workpiece to a processing device for processing of the workpiece,
wherein a second partial path feeds workpieces to the first partial path for conveyance of the workpiece via the primary conveyance means, the second partial path comprising means of separation that operate, at least in sections, along the first partial path of the conveyance path to separate one workpiece from a trailing workpiece trailing in the conveyance direction,
wherein the means of separation feature at least one spacer, which can be displaced in the conveyance direction between a starting position and a distant ending position in the conveyance direction and is controllable by control means in such a manner that after the workpiece passes the starting position the spacer switches into an active mode, in which it is placed behind the workpiece in the conveyance direction and tracks it, thereby forming a minimum spacing between the workpiece and the trailing workpiece, and upon reaching the ending position, switches into an inactive mode and returns to the starting position.

12. The processing station according to claim 11, wherein the workpiece conveyance is intermittent, at least through the primary conveyance means, the conveyance of the workpiece by the primary conveyance means, upon reaching a stopping point in which a processing station processes or tests the workpiece in a processing period, suspends the conveyance of the workpiece in the conveyance direction during the processing period or occurs with a changed conveyance speed of the workpiece.

13. The conveyor device of claim 1, wherein the workpieces comprise circuit boards.

14. The conveyor device according to claim 2, wherein the processing station comprises a test station.

15. The conveyor device according to claim 3 wherein the at least one conveyor belt is endless.

16. A conveyor device for the conveyance of workpieces in a conveyance direction from downstream to upstream along a conveyance path, comprising:
a primary conveyance provided for conveyance of the workpiece along a first partial path of the conveyance path;
a secondary conveyance provided for conveyance of the workpiece along a second partial path of the conveyance path, which is placed downstream of the first partial path in the conveyance direction in order to feed workpieces to the first partial path; and
a separator provided that operates along the first partial path, at least in sections, to separate a first workpiece from a downstream trailing workpiece trailing the first workpiece in the conveyance direction; and
the separator includes at least one spacer which can be displaced in the conveyance direction between a downstream starting position and a distant ending position in the conveyance direction and is controllable by control means in such a manner that after the first workpiece passes the starting position the spacer switches into an active mode in which it is placed downstream from and behind the first workpiece in the conveyance direction and tracks the first workpiece in the conveyance direction, it, thereby forming a minimum spacing between the workpiece and the trailing workpiece in the conveyance direction, and upon reaching the ending position, switches into an inactive mode in which the spacer returns in the downstream direction to the starting position.

17. The conveyor device according to claim 16, wherein the primary conveyance includes at least one endless conveyor belt.

18. The conveyor device according to claim 17, wherein the primary conveyance includes at least one secondary endless conveyor belt, positioned at a distance thereto and at an angle to the conveyance direction, the respective movements of which at least one endless conveyor belt and at least one secondary endless conveyor belt are calibrated to each other for the conveyance of the workpiece.

* * * * *